United States Patent [19]
Wright et al.

[11] Patent Number: 5,899,077
[45] Date of Patent: May 4, 1999

[54] THERMOELECTRIC COOLING/HEATING SYSTEM FOR HIGH PURITY OR CORROSIVE LIQUIDS

[75] Inventors: Lloyd F. Wright, Hopewell Junction, N.Y.; Justice N. Carman, Valley Center, Calif.; Mark A. Logan, Pleasant Valley, N.Y.

[73] Assignee: Solid State Cooling Systems, Inc., Poughkeepsie, N.Y.

[21] Appl. No.: 08/982,820

[22] Filed: Dec. 2, 1997

[51] Int. Cl.$^6$ ..................................................... F25B 21/02
[52] U.S. Cl. .............................................. 62/3.7; 165/168
[58] Field of Search ................................ 62/3.2, 3.3, 3.7; 165/168, 170, 905

[56] References Cited

U.S. PATENT DOCUMENTS

| | | | |
|---|---|---|---|
| 3,001,766 | 9/1961 | Laist | 165/905 |
| 3,212,274 | 10/1965 | Eidus | 62/3.7 |
| 3,448,798 | 6/1969 | Coe | 165/170 |
| 4,583,583 | 4/1986 | Wittel | 165/46 |
| 4,989,626 | 2/1991 | Takagi et al. | 137/13 |
| 5,561,981 | 10/1996 | Quisenberry | 62/3.7 |

OTHER PUBLICATIONS

AAVID Thermal Technologies, Inc., "High Power" Sales Brochure, Jan. 1996, pp. 174–178.
Wakefield Engineering, "Liquid Cold Plates for High-Performance Components and Systems" Sales Brochure, Oct. 1995, pp. 177–180.

*Primary Examiner*—William Doerrler
*Attorney, Agent, or Firm*—Townsend and Townsend and Crew LLP

[57] ABSTRACT

A novel thermoelectric liquid heat exchange device for corrosive or high purity liquids is provided for. The heat exchange device has an array thermoelectric modules, with first and second heat exchanger plates arranged so as to sandwich the thermoelectric modules between the heat exchanger plates. One of the heat exchanger plates has a thermally conductive metal base plate, plastic tubing and a cover plate. The base plate has a flat side contacting the thermoelectric modules, and an opposing side with grooves of a preselected depth. The plastic tubing has a diameter to match the depth of the grooves so that the tubing engages the grooves. The cover plate is fastened to the base plate and over the plastic tubing in the grooves of the base plate to press the tubing into the grooves to improve thermal contact between the plastic tubing and the base plate. The plastic tubing carries the corrosive or high purity liquids for heating or cooling by the operation of the thermoelectric modules and the other heat exchanger plate.

31 Claims, 4 Drawing Sheets

5,899,077

THERMOELECTRIC COOLING/HEATING SYSTEM FOR HIGH PURITY OR CORROSIVE LIQUIDS

BACKGROUND OF THE INVENTION

Many processes in the semiconductor and medical industries require temperature control of liquids which are corrosive, or which must be maintained at high purity levels. In the semiconductor industry, ultrahigh purity acids used in cleaning silicon wafers must be temperature-controlled during processing. De-ionized water which is saturated with ozone requires precise temperature control for proper stripping of photo-resist from wafers after plasma etching operations. In the medical industry, temperature of a patient's blood must be controlled during an operation or an analysis. In each of these examples, standard metal tube heat exchange devices, or stated more precisely, the standard metal tube heat exchanger plates, often called cold plates, in heat exchange devices, cannot be used because of the resulting metal contamination of the fluid.

Additionally, in the semiconductor industry it is desirable to be able to clean a temperature-control cooling/heating unit easily, should contamination occur. In the medical industry it is a common practice to dispose of all materials in contact with one patient to ensure no infectious diseases are transmitted to another patient. Any vessels or tubing holding blood should be replaced for the next patient. Thus, it is desirable to have the elements which contact the liquid in a heating/cooling unit be constructed either from chemically inert materials which may be easily cleaned, or from materials which can be easily replaced at low cost.

Since the heating and cooling capacities required in both industries are relatively small, thermoelectric technology can be effectively used. The present invention provides for a thermoelectric liquid heat exchange device which can precisely control the temperature of corrosive liquids or liquids of high purity without contamination. Elements which are in contact with the liquids may be replaced easily and at relatively low cost.

SUMMARY OF THE INVENTION

The present invention provides for a thermoelectric liquid heat exchange device for corrosive or high purity liquids. The heat exchange device has at least one thermoelectric module, and first and second heat exchanger plates arranged so as to sandwich the thermoelectric module between the heat exchanger plates. One of the heat exchanger plates further comprises a thermally conductive metal base plate, plastic tubing and a cover plate. The base plate has a flat side contacting the thermoelectric module, and an opposing side having grooves therein with a preselected depth. The plastic tubing has a diameter to match the depth of the grooves so that the tubing engages the grooves. The cover plate is fastened to the base plate and over the plastic tubing in the grooves of the base plate to presses the tubing into the grooves to improve thermal contact between the plastic tubing and the base plate. The plastic tubing carries the corrosive or high purity liquids for heating or cooling by the operation by the thermoelectric module and the other heat exchanger plate. The plastic tubing is immune to the action of the corrosive liquids and may be easily replaced at relatively low cost.

BRIEF DESCRIPTION OF THE DRAWINGS

FIG. 2A is a top view of a heat exchanger base plate; FIG. 2B is a top view of a cover plate for the FIG. 2A heat exchanger base plate; FIG. 2C is a end view of the assembled FIG. 2A heat exchanger base plate and the FIG. 2B cover plate; FIG. 2D is an end view of the separated base plate and cover plate;

FIG. 4A is a top view of the base plate; FIG. 4B is a cross-sectional side view of the FIG. 4A base plate along line B–B'; FIG. 4C is a top view of the cover plate for the FIG. 4A base plate; and FIG. 4D is an end view of the assembled base plate and cover plate.

DETAILED DESCRIPTION OF SPECIFIC EMBODIMENTS

Figure 1:
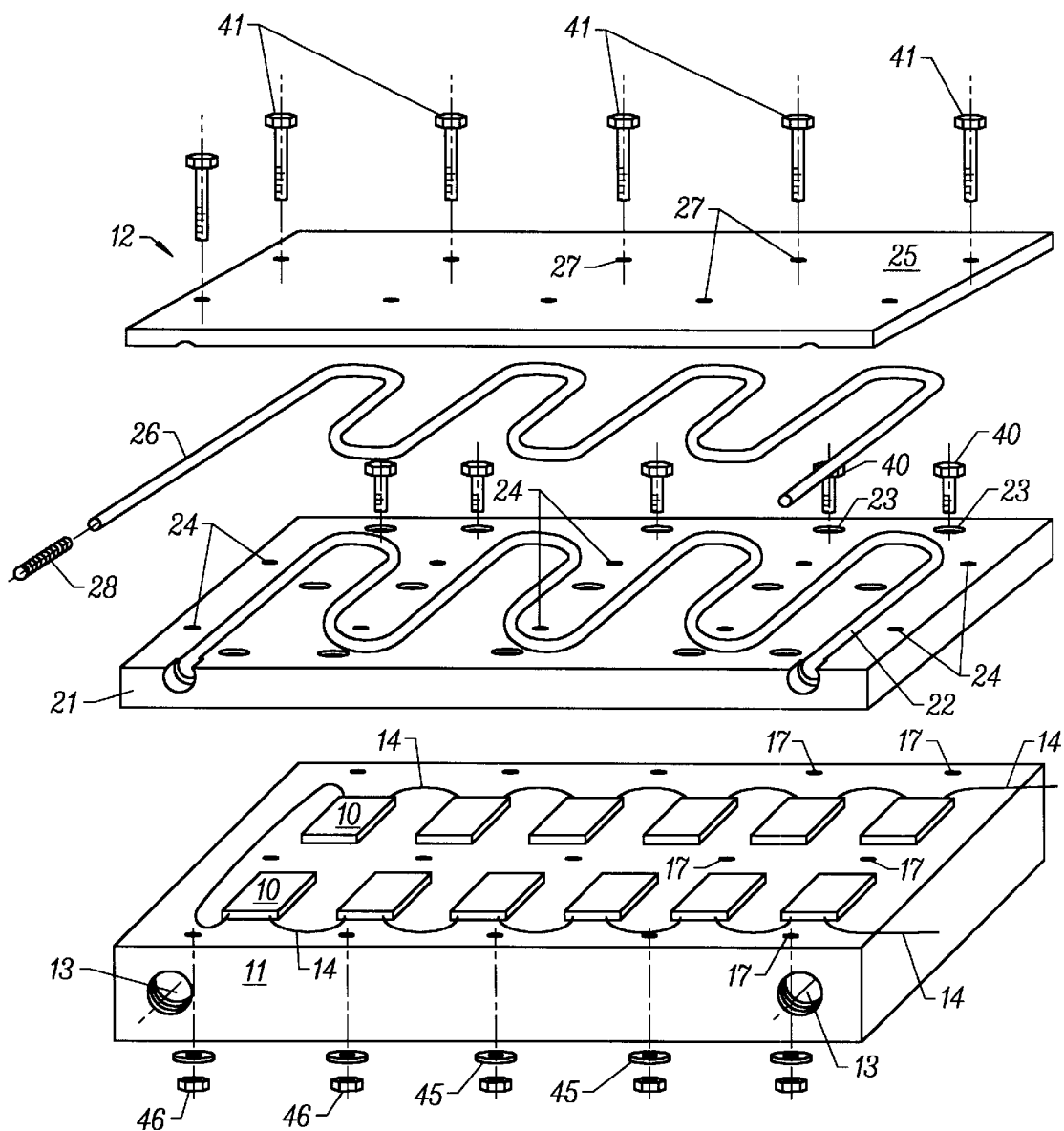
FIG. 1 is an exploded view of a thermoelectric heat exchange device according to one embodiment of the present invention.

It should be noted that where the element or function of an element has not substantially changed, the same reference numerals is used for the element in the drawings to further an understanding of the present invention in its various aspects.

The general structure of a thermoelectric heat exchange device is illustrated in U.S. Pat. No. 5,584,183, entitled, "THERMOELECTRIC HEAT EXCHANGER", which issued Dec. 17, 1996 and assigned to the present assignee. Thermoelectric heat exchange devices have an array of thermoelectric modules which are placed between two heat exchanger plates. When an electric current is passed through the thermoelectric modules, the thermoelectric modules transfer heat from one of the heat exchanger plates to the other. Gases, such as air, or liquids are typically passed through channels in each of the heat exchanger plates for heating and cooling. One heat exchanger plate carries the medium, gas or liquid, to be heated or cooled, and the other heat exchanger plate carries the medium which is to act as the heat source or sink. Standard air cooled finned heat sinks may be used for air cooling.

The present invention provides for thermoelectric heating and cooling with a liquid heat exchange device which transfers heat, by the operation of the thermoelectric devices, to and from liquids flowing through chemically inert tubing which can be easily replaced.

An embodiment of the present invention, which provides for a thermoelectric heat exchange device which can handle corrosive or highly pure liquids, is illustrated in FIG. 1. The heat exchange device has an array of thermoelectric modules 10 which are sandwiched between two heat exchanger plates 11 and 12. The thermoelectric modules 10 are electrically connected by leads 14 which carry the electric current through the modules 10. The heat exchanger plate 11 has a channel 13 for carrying liquid or air which operates as a heat source or sink for the thermoelectric modules 10 and the heat exchanger plate 12. An example of a heat exchanger plate which might be used or adapted for the heat exchanger plate 11 is described in U.S. patent application Ser. No. 08/885,022, entitled, "A LOW-COST LIQUID HEAT TRANSFER PLATE AND METHOD OF MANUFACTURING THEREFOR," filed Jun. 30, 1997 by Lloyd F. Wright and Justice Carman.

The second heat exchanger plate 12 carries the high purity or corrosive liquids. The heat exchanger plate 12 includes a cover plate 25, a grooved base plate 21 and plastic tubing 26 between the two plates 21, 25. The plastic tubing 26 carries the corrosive/high purity liquids. In the assembly of the heat exchange device, the base plate 21 of the heat exchanger plate 12 is designed to engage the other heat exchanger plate 11 by bolts 40 which fit into holes 23 in the base plate 21. The bolts 40 fit through holes 17 in the heat exchanger plate 11. With washers 45 and screws 46 engaging the threads of the bolts 40, the thermoelectric modules 10 are precisely clamped between the base plate 21 and the heat exchanger plate 11. Thin layers of thermally conductive grease between the modules 10 and the base plate 21 and the heat exchanger plate 11 respectively increase the thermal contact between these elements.

In the subassembly of the heat exchanger plate 12, separate screws 41 engage the cover plate 25 through holes 27 into threaded holes 24 in the base plate 21. Grooves 22 in the base plate 21 hold the plastic tubing 26 when the cover plate 25 and the base plate 21 are clamped together. To assure a tight engagement between the flat surfaces of the cover plate 25 and the base plate 21, the base plate holes 23 are counter-bored so that the heads of the bolts 40 lie below the top surface of the plate 21 when the bolts 40 engage the heat exchanger plate 11.

It should be noted that the base plate 21, the thermoelectric modules 10 and the heat exchanger plate 11 are clamped together separately from the plastic tubing 26 and the cover plate 25. The cover plate 25 can be removed without changing the clamping force on the modules 10. This allows easy replacement of the plastic tubing 26 without potentially damaging the thermoelectric modules 10 or disturbing their thermal interface to the heat exchanger plates 11 and 12 on either side of the modules 10.

FIGS. 2A–2D details the elements of one embodiment of the heat exchanger plate 12, which include the base plate 21, the cover plate 25, and the plastic tubing 26, which is fixed between the plates 21 and 25, as described previously. When the heat exchanger plate 12 is assembled, the cover plate 25 holds the plastic tubing 26 in grooves 22 in one surface of the base plate 21. The plastic tubing 26 form a noncontaminating channel to carry the corrosive and/or high purity liquids.

Figure 2A:
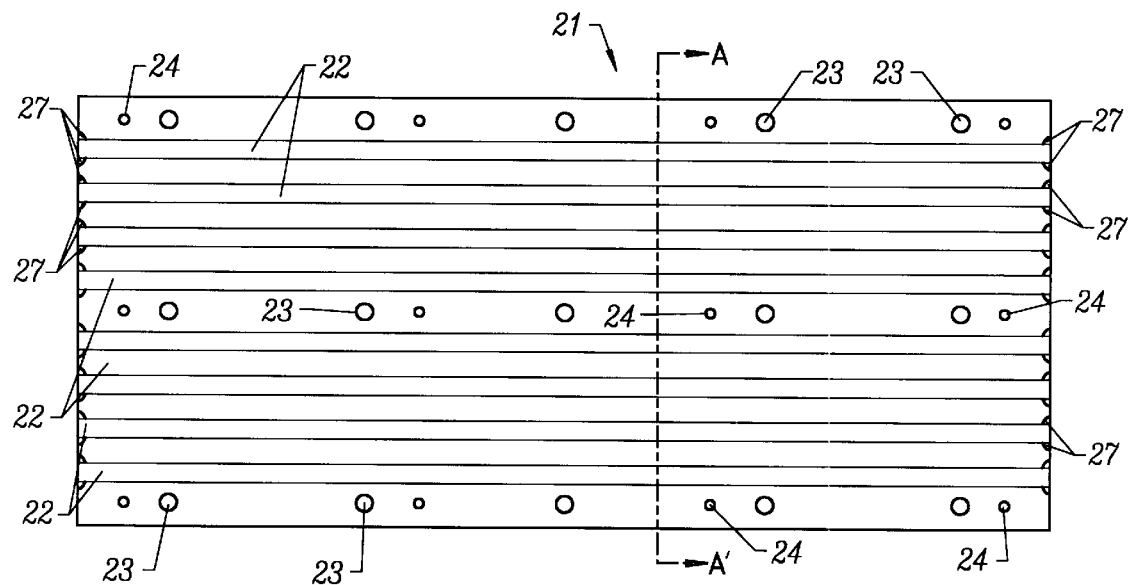
FIGS. 2A–2D detail a heat exchanger plate for the FIG. 1 heat exchange device.
Figure 2B:
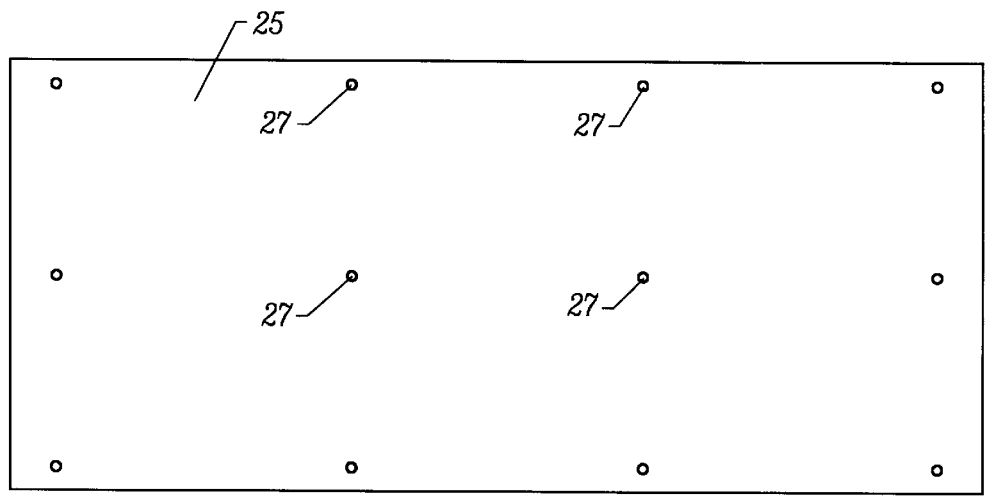

As illustrated in FIG. 2A, the exchanger base plate 21, formed from aluminum or other thermally conductive metal, has one flat surface for interfacing with the thermoelectric modules 10 (not shown in FIG. 2A) and an opposing surface with the grooves 22, which are straight in this embodiment. FIG. 2B illustrates a cross-section of the base plate 21 along a line A–A' of FIG. 2A with the grooves 22. The base plate 21 also has the counter-bored mounting holes 23 so that the plate 21 can be bolted to the rest of the thermal heat exchange device, as explained above. The grooves 22 are machined to conform to the size of the thin-walled plastic tubing 26. The tubing, shown in FIG. 3, is laid in the grooves 22 upon assembly of the heat exchanger plate 12. The grooves 22 are machined to a depth slightly less than the diameter of the tubing 26. Suitable plastic for the tubing 26 can be one of a variety of tetrafluoroethylene polymers, such as Teflon (which is a registered trademark of the E. I. Du Pont de Nemours & Company, Inc., of Wilmington, Del.).

Figure 2C:
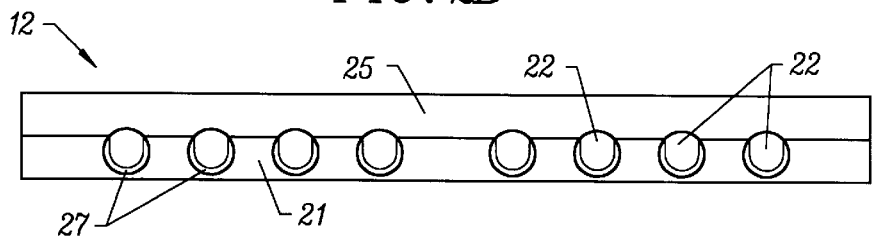

The flat cover plate 25, illustrated in the top view of FIG. 2B, is fastened to the heat exchanger base plate 21 on its grooved side. The cover plate 25 has through the holes 27 which match the threaded holes 24 in the base plate 21. The holes 24 receive screws 41 (shown in FIG. 1) to hold the plate 25 against the base plate 21, as illustrated in FIG. 2C.

When fastened tightly, the cover plate 25 compresses the tubing 26 slightly. This compression, combined with internal pressure from the fluid flowing through the tubing 26 during operation of the heat exchanger, applies force against the tubing surface to press the surface into intimate contact with the metal surface of the grooves 22. A thin layer of thermally conductive oil or grease in each groove 22 further enhances the thermal contact between the tubing 26 and surface of the metal groove 22. If properly selected, this oil or grease can also serve as a barrier to reduce the inward diffusion of air through the tubing 26 into the liquid and to reduce the outward diffusion of the liquid through the tubing 26 to the grooves 22.

Figure 2D:
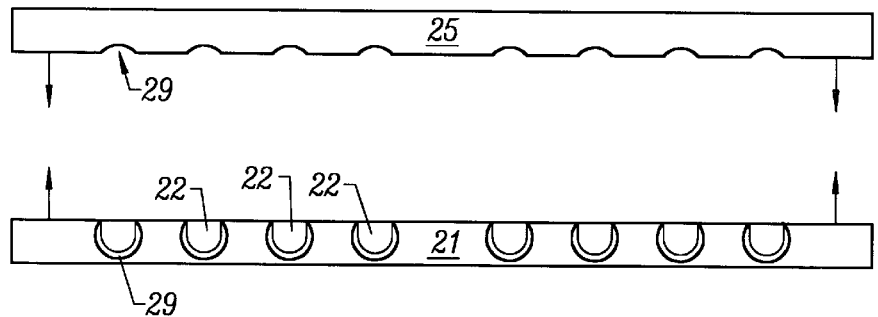

FIG. 2D show an end view of the cover plate 25 and the base plate 21 and how they are assembled. Note that the grooves 22 at the edge of the base plate 21 have counter-bores 29, which also extend slightly into the cover plate 25. The counter-bores 29 accommodate the spring tube benders 28, discussed below, while at the same time allowing the cover plate 25 to compress the plastic tubing 26 into the grooves 22.

Figure 3A:
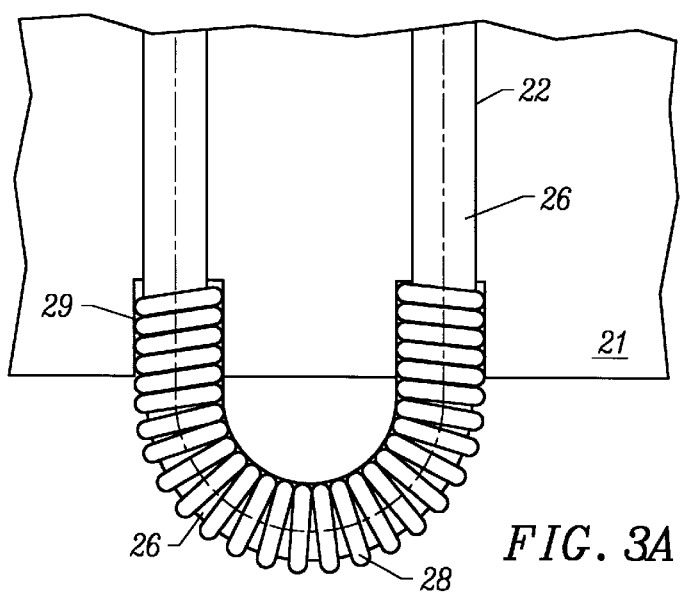
FIG. 3A is an exemplary detailed view of a coiled tube bender element mounted in counter-bored holes in a base plate.
Figure 3B:
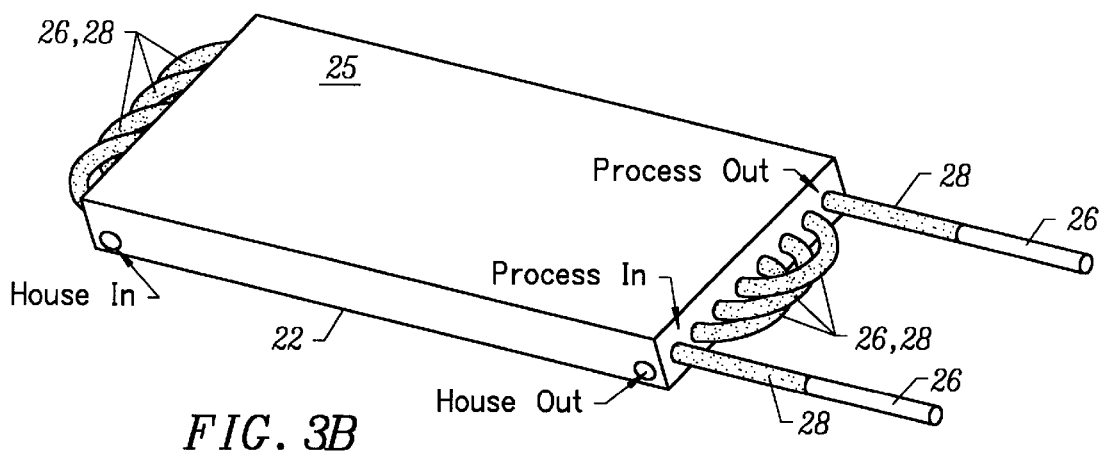
FIG. 3B is a perspective view of the complete assembly of the FIGS. 2A–2D heat exchanger plate with heat bender elements.

As shown in FIG. 2A, the grooves 22 are straight and parallel. A manifold at each end of the base plate 21 can be used to connect tubing in the grooves 22, or a single tube can be used to exit one groove 22 in the plate 21, bend 180° in an external loop and return into another groove 22. Since Teflon manifolds can be very expensive to fabricate, the second alternative with a long length of Teflon tubing is preferable. Standard coiled wire "tube benders" 28, such as those made by General Tool Mfg. of New York City, N.Y., hold the Teflon tubing 26 outside the plate 21. The tube benders 28, basically spring coils as shown in FIG. 3B, protect the Teflon tubing 26 outside of the base plate 21 from damage, while also confining the Teflon tubing 26 to prevent kinking in its the thin walls. The tube benders 28 also guide the tubing 26 in external loops from one groove 22 to another. The counter-bores 29 in the base plate 21 at the ends of each groove 22 (and in corresponding locations in the cover plate 25, as shown in FIGS. 3C–3E) have slightly smaller diameters than that of the tube benders 28 to engage and lock the ends of the bender springs 28 in place, as shown in FIG. 3A. The tube benders 28 and enclosed Teflon tubing 26 form loops at both ends of the base plate 21.

Because of the large bend radius required to prevent Teflon tubing 26 from kinking (see Table 1 below), the grooves 22 must be either far apart, or more efficiently, the tubing 26 should not return to an adjacent groove 22. As shown in FIG. 3B, the Teflon tubing 26 is laid into the groove 22 at one, say top, edge of the base plate 21 and loops to the fourth groove 22 from the first groove 22 at one end of the base plate 21. The spring tube benders 28, which are shaded in the drawing, hold the tubing 26 external to the base and cover plates 21 and 25. After passing through the fourth groove 22, the tubing 26 at the opposite end of the base plate 21 loops around to enter the second groove 22 from the top. This looping process is repeated until all grooves 22 are filled with tubing 26. The completed assembly of the heat exchanger plate 12 shown in FIG. 3B illustrates how the spring tube benders 28 ensure the bend radius is equal to or greater than the minimum required for the tubing 26. The spring tube benders 28 are also placed around the tubing 26 as it enters and exits the heat exchanger plate 12. Facility water enters and exits the openings labeled, House In and House Out.

After the assembly of the plastic tubing 26 and cover plate 25 to the assembly, hot (above 50° C.) water or some other liquid is passed through the tubing 26 at a pressure of 40 psig. This process removes ripples or kinks from the tubing 26, at least in the case of Teflon tubing, to improve contact between the tubing 26 and the metal grooves 22.

An additional improvement in performance is achieved with the insertion of turbulence generators inside the plastic tubing 26. The turbulence generators may be in form of plastic coils, such as used for book binding. Teflon or other chemically pure and contamination resistant plastic are used for the coils. The coils also provide some rigidity to the thin-walled plastic tubing 26, especially in the case of Teflon tubing, in the serpentine groove arrangement and simplifies the task of placing the Teflon tubing 26 into the grooves 22.

Figure 4A:
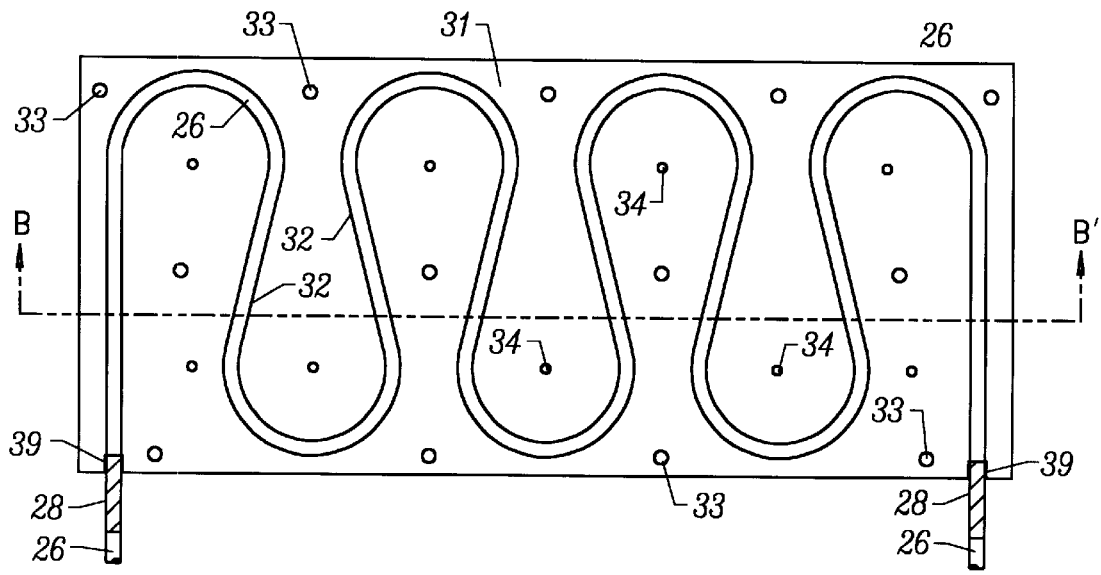
FIGS. 4A–4D show an alternative heat exchanger plate with a serpentine groove pattern.
Figure 4B:
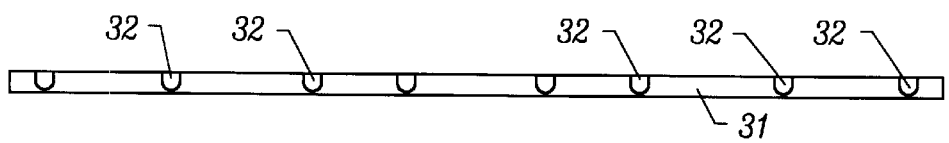
Figure 4C:
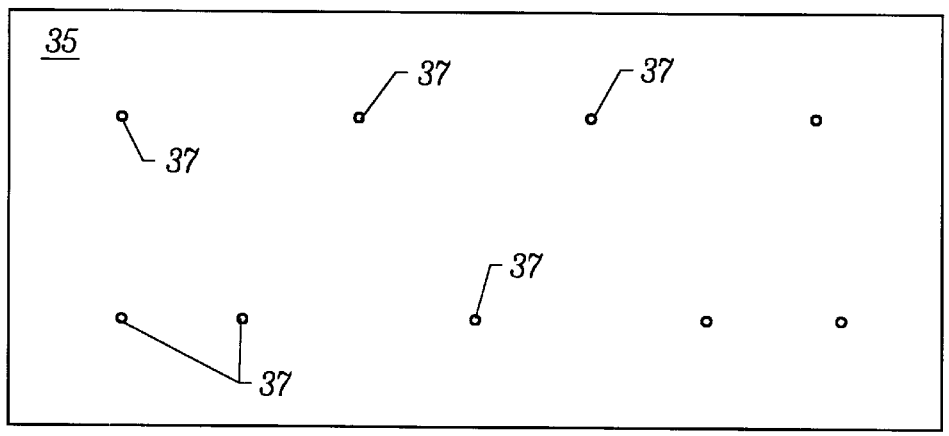
Figure 4D:
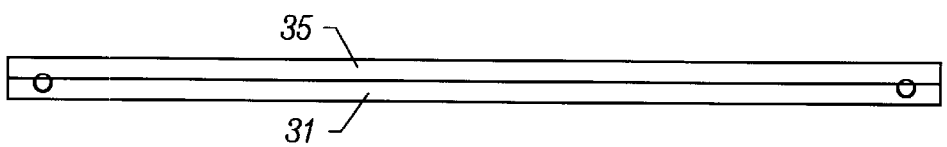

Rather than a completely straight and parallel pattern of grooves 22, the groove pattern in the base plate 21 may be a serpentine arrangement or combinations of serpentine and straight patterns. FIG. 1 illustrates a base plate 21 with a serpentine groove pattern. FIGS. 4A–4D illustrate the heat exchanger plate 12 with a heat exchanger base plate 31 with another serpentine groove pattern. FIG. 4A illustrates a top view of the base plate 31 and FIG. 4B shows a cross-sectional view along line B–B' in FIG. 4A. As described above, once the base plate 31 has been fastened to the facility water heat exchanger plate/thermoelectric assembly via counter-bored holes 34, the thin-walled tubing 26, preferably Teflon, is laid into the serpentine grooves 32. A cover plate 35, a top view of which is shown in FIG. 4C, is then fastened to the assembly of the base plate 31 and plastic tubing 26 by the through holes 36 in the cover plate 35 and threaded holes 37 in the base plate 31. When the cover plate 35 and the base plate 31 are assembled as illustrated in the side view of FIG. 4D, spring tube benders 28 are placed around the tubing 26 entering and exiting the system and snapped into slightly smaller diameter counter-bores 39.

Surprisingly high rates of heat transfer and overall cooling capacities have been achieved with the present invention. A system, measuring 22"×10"×2", with 15 feet of 0.370 IC×0.390 OD PTFE Teflon tubing and 48 iTi Ferrotec 6300/127/085 thermoelectric modules (made by Ferrotec International Thermoelectric, Inc. of Chelmsford, Mass.), has achieved a cooling capacity of 1500 Watts with 20° C. facility cooling water at 4 gpm and a process fluid of de-ionized water saturated with ozone at 2 gpm, also at 20° C. The process water purity level was maintained at less than 1 part per billion (ppb) total metal content. This performance, in terms of cooling capacity and purity levels, is far superior to those of other current heat exchangers.

While the foregoing is a complete description of the certain embodiments of the invention, it should be obvious that various modifications, alternatives and equivalents may be used. Accordingly, the above description should not be taken as limiting the scope of the invention which is defined by the metes and bounds of the appended claims.

What is claimed is:

1. A thermoelectric liquid heat exchange device for corrosive or high purity liquids comprising:
    at least one thermoelectric module;
    first and second heat exchanger plates arranged so as to sandwich said thermoelectric module therebetween;
    said first heat exchanger plate further comprising:
        a thermally conductive metal base plate having a flat side contacting said thermoelectric module, and an opposing side having grooves therein with a preselected depth;
        plastic tubing dimensioned so that said grooves snugly receive said tubing;
        a thermally conductive grease between said plastic tubing and said grooves to enhance contact between said plastic tubing and said base plate, said thermally conductive grease selected so that diffusion of gas and liquid through said elastic tubing is reduced; and
    a cover plate fastened over said plastic tubing in said thermally conductive metal plate to press said tubing into said grooves for improved thermal contact.

2. The thermoelectric liquid heat exchange device of claim 1 wherein said plastic tubing comprises tetrafluoroethylene polymers.

3. The thermoelectric liquid heat exchange device of claim 2 wherein said plastic tubing comprises PTFE.

4. The thermoelectric liquid heat exchange device of claim 2 wherein said plastic tubing has a wall thickness of less than, or equal to, 0.015 inches.

5. The thermoelectric liquid heat exchange device of claim 1 wherein said plastic tubing has a diameter to match said depth of said grooves so that said tubing engages said grooves.

6. The thermoelectric liquid heat exchange device of claim 1 further comprising a mounting of said base plate, said second heat exchanger plate and said thermoelectric module so that said cover plate can be removed from said base plate without disturbing said mounting.

7. The thermoelectric liquid heat exchange device of claim 6 wherein said mounting comprises a plurality of bolts, each bolt passing through said base plate and said second heat exchanger plate, a plurality of nuts engaging said bolts so that base plate and second heat exchanger plate fixedly sandwich said thermoelectric module therebetween.

8. The thermoelectric liquid heat exchange device of claim 1 further comprising turbulence generator elements inside said plastic tubing where said grooves receive said plastic tubing.

9. The thermoelectric liquid heat exchange device of claim 8 further comprising spring benders enclosing portions of said plastic tubing extending outside of said base plate.

10. The thermoelectric liquid heat exchange device of claim 9 wherein said grooves have countersunk bores at edges of said base plate for engaging said spring benders.

11. The thermoelectric liquid heat exchange device of claim 8 wherein said turbulence generator elements comprise plastic coiled wire.

12. The thermoelectric liquid heat exchange device of claim 11 wherein said turbulence generator elements comprise tetrafluoroethylene polymers.

13. For a thermoelectric liquid heat exchange device for corrosive or high purity liquids having at least one thermoelectric module, and first and second heat exchanger plates arranged to sandwich said thermoelectric module therebetween, said first heat exchanger plate comprising
    a thermally conductive base plate with one flat side contacting the thermoelectric module, said thermally conductive metal plate with an opposing side into which a thin-walled plastic tubing is laid into matching groves in a straight parallel pattern into a depth slightly less than a diameter of said plastic tubing into the surface; and
    a cover plate fastened over said plastic tubing in said thermally conductive metal plate which presses said plastic tubing into said grooves, to improve thermal contact, said base plate having a first set of holes for receiving bolts so that said base plate, said second heat exchanger plate and said thermoelectric module therebetween can be mounted without said cover plate.

14. The heat exchanger plate of claim 13 wherein said plastic tubing comprises tetrafluoroethylene polymers.

15. The heat exchanger plate of claim 14 wherein said plastic tubing comprises PTFE.

16. The heat exchanger plate of claim 14 wherein said plastic tubing has a wall thickness of less than, or equal to, 0.015 inches.

17. The heat exchanger plate of claim 13 further comprising a thermally conductive grease between said plastic tubing and said grooves to enhance contact between said plastic tubing and said thermally conductive plate.

18. The heat exchanger plate of claim 17 wherein said thermally conductive grease is selected so that diffusion of gas and liquid through said plastic tubing is reduced.

19. The heat exchanger plate of claim 13 further comprising spring benders enclosing portions of said plastic tubing outside of said base plate.

20. The heat exchanger plate of claim 19 wherein said grooves have countersunk bores at edges of said base plate for engaging said spring benders.

21. The heat exchanger plate of claim 13 further comprising turbulence generator elements inside of said plastic tubing.

22. The heat exchanger plate of claim 21 wherein said turbulence generator elements comprise plastic coiled wire.

23. The heat exchanger plate of claim 22 wherein said turbulence generator elements comprise tetrafluoroethylene polymers.

24. The heat exchanger plate of claim 13 wherein said base plate has a second set of holes for receiving screws so that said cover plate can be mounted to said base plate and removed from said base plate without disturbing said base plate, said second heat exchanger plate and said thermoelectric module therebetween.

25. The thermoelectric liquid heat exchange device of claim 6 further comprising turbulence generator elements inside said plastic tubing where said grooves receive said plastic tubing.

26. The thermoelectric liquid heat exchange device of claim 25 wherein said turbulence generator elements comprise plastic coiled wire.

27. The thermoelectric liquid heat exchange device of claim 26 wherein said turbulence generator elements comprise tetrafluoroethylene polymers.

28. The thermoelectric liquid heat exchange device of claim 25 wherein said plastic tubing has a diameter to match said depth of said grooves so that said tubing engages said grooves.

29. The thermoelectric liquid heat exchange device of claim 5 further comprising turbulence generator elements inside said plastic tubing where said grooves receive said plastic tubing.

30. The thermoelectric liquid heat exchange device of claim 29 wherein said turbulence generator elements comprise plastic coiled wire.

31. The thermoelectric liquid heat exchange device of claim 30 wherein said turbulence generator elements comprise tetrafluoroethylene polymers.

* * * * *